(12) United States Patent
Im et al.

(10) Patent No.: US 9,054,067 B2
(45) Date of Patent: Jun. 9, 2015

(54) SEMICONDUCTOR PACKAGE WITH THERMAL DISSIPATING MEMBER AND METHOD OF MANUFACTURING THE SAME

(71) Applicant: Samsung Electronics Co., Ltd., Suwon-si (KR)

(72) Inventors: Yun-Hyoek Im, Hwaeong-si (KR); Kyol Park, Daejeon (KR); Hee-Seok Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/095,376

(22) Filed: Dec. 3, 2013

(65) Prior Publication Data

US 2014/0217576 A1 Aug. 7, 2014

(30) Foreign Application Priority Data

Feb. 5, 2013 (KR) .................. 10 2013 0012923

(51) Int. Cl.
*H01L 23/367* (2006.01)
*H01L 23/373* (2006.01)
*H01L 23/31* (2006.01)
*H01L 23/427* (2006.01)

(52) U.S. Cl.
CPC ... *H01L 23/3733* (2013.01); *H01L 2224/16225* (2013.01); *H01L 2924/15311* (2013.01); *H01L 23/3128* (2013.01); *H01L 23/3736* (2013.01); *H01L 23/4275* (2013.01)

(58) Field of Classification Search
CPC ............... H01l 23/3733; H01l 23/4275; H01l 23/3128; H01l 23/3736; H01l 2224/16225; H01l 2924/15311

USPC ......... 257/704, 675, 712, 713, 717, 720, 721, 257/722, 738, 778, 737, 707, E23.102
See application file for complete search history.

(56) References Cited

U.S. PATENT DOCUMENTS

| | | | | |
|---|---|---|---|---|
| 5,349,496 | A | * | 9/1994 | Taniguchi et al. ............ 361/528 |
| 5,533,256 | A | * | 7/1996 | Call et al. ........................ 29/840 |
| 6,673,328 | B1 | | 1/2004 | Klett et al. |
| 6,696,138 | B2 | * | 2/2004 | Sakai et al. .................... 428/209 |
| 6,705,393 | B1 | | 3/2004 | Hsu |
| 6,764,759 | B2 | | 7/2004 | Duvall et al. |

(Continued)

FOREIGN PATENT DOCUMENTS

| | | |
|---|---|---|
| JP | 2003527753 | 9/2003 |
| JP | 2004200428 | 7/2004 |

(Continued)

*Primary Examiner* — Alexander Oscar Williams
(74) *Attorney, Agent, or Firm* — Onello & Mello, LLP.

(57) ABSTRACT

A semiconductor package and a method of manufacturing the same are disclosed, wherein the semiconductor package includes a circuit board, a semiconductor chip mounted on the circuit board, an encapsulant positioned on the circuit board and encapsulating the semiconductor chip to the circuit board, and a thermal dissipating member positioned on the encapsulant and having a heat spreader that dissipates a driving heat from the semiconductor chip and a heat capacitor that absorbs excess driving heat that exceeds a heat transfer capability of the heat spreader, such that when a high power is applied to the package, the excess heat is absorbed into the heat capacitor as a latent heat and thus the semiconductor chip is protected from an excessive temperature increase caused by the excess heat, thereby increasing a critical time and performance duration time of the semiconductor package.

20 Claims, 8 Drawing Sheets

(56) References Cited

U.S. PATENT DOCUMENTS

| | | | |
|---|---|---|---|
| 6,892,798 B2 | 5/2005 | Lee et al. | |
| 7,180,179 B2 * | 2/2007 | Mok et al. | 257/714 |
| 7,713,733 B2 * | 5/2010 | Cliffel et al. | 435/305.1 |
| 2002/0012762 A1 * | 1/2002 | Bunyan | 428/40.2 |
| 2003/0007328 A1 | 1/2003 | Fischer | |
| 2004/0146772 A1 * | 7/2004 | Miyao et al. | 429/38 |
| 2005/0007740 A1 | 1/2005 | Neuschuetz et al. | |
| 2008/0079146 A1 * | 4/2008 | Hattori et al. | 257/707 |
| 2009/0288705 A1 * | 11/2009 | Hiwatashi et al. | 136/256 |
| 2012/0217289 A1 * | 8/2012 | Lee et al. | 228/223 |

FOREIGN PATENT DOCUMENTS

| | | |
|---|---|---|
| JP | 2005064093 | 3/2005 |
| JP | 2005093847 | 4/2005 |
| KR | 1020070079891 | 8/2007 |
| KR | 0683712 | 9/2007 |
| KR | 1020080103288 | 11/2008 |
| KR | 100949786 | 3/2010 |

\* cited by examiner

US 9,054,067 B2

SEMICONDUCTOR PACKAGE WITH THERMAL DISSIPATING MEMBER AND METHOD OF MANUFACTURING THE SAME

CROSS-REFERENCE TO RELATED APPLICATIONS

This application claims the benefit of Korean Patent Application No. 10-2013-0012923 filed on Feb. 5, 2013 in the Korean Intellectual Property Office, the disclosure of which is incorporated herein in its entirety by reference.

BACKGROUND

1. Field

Embodiments of the inventive concepts relate to a semiconductor package and a method of manufacturing the same, and more particularly, to a semiconductor package having a heat spreader and a thermal capacitor and a method of manufacturing the same.

2. Description of the Related Art

As electronic devices have become more highly integrated and designed to deliver higher performance, the semiconductor package is also increasingly being manufactured to have a smaller size and higher density. Higher performance of a high density semiconductor package operating at higher speed necessarily generates a larger quantity of heat in the semiconductor package. Thus, sufficient thermal dissipation of the excess heat becomes one of the most important factors for increasing the operational stability and product reliability of a state-of-the-art semiconductor package and of electronic systems including such a semiconductor package. For those reasons, various heat dissipation systems have been suggested for high density semiconductor packages.

In conventional thermal dissipation systems, a major portion of the heat is dissipated by thermal conduction in which a thermal dissipation member makes direct contact with the semiconductor package. Also, in these conventional systems, a minor portion of the heat may be dissipated by thermal convection, such as by a forced circulation of air. For example, a dissipating plate, such as a heat spreader, is usually arranged on the semiconductor package in selective conjunction with an active circulator of air. Thus, most of the heat is dissipated outwards from the semiconductor package through the heat spreader by the heat conduction, and residuals of the heat are also dissipated through the actively-circulated air by heat convection. However, the heat transfer rate for heat dissipation by heat conduction using the metal that comprises the heat spreader is often inadequate. In the same way, the heat transfer rate for heat dissipation by heat convection using a convection fluid is also often insufficient regardless of the degree of natural and forced convection.

Recent electronic devices require high instantaneous driving power for a moment due to various applications for such devices, such as mobile web and home appliances. These devices also typically require high average power due to their high performance design. The average heat generated from a high performance semiconductor package when an average driving power is applied can typically be sufficiently dissipated through the conventional thermal dissipation system; and, thus, the semiconductor package can be maintained under thermal control. However, the large quantity of substantially instantaneous heat that is commonly generated from the semiconductor package when an instantaneous driving power is applied cannot be sufficiently dissipated through the conventional thermal dissipation system.

In conventional semiconductor packages, when the temperature of an integrated circuit (IC) chip in the semiconductor package reaches a maximal point, the driving power is designed to be automatically shut off through a temperature control program in the thermal dissipation system so as to reduce the temperature of the IC chip. However, such an automatic power shut-off to the IC chip necessarily decreases the performance of the IC chip. Thus, the IC chip is forced to operate below the maximal performance and driving specifications. As a result, the average performance of the semiconductor package having the IC chip may decrease due to the automatic power shut-off under excessive heat conditions.

Accordingly, there has been a need for a new thermal dissipation system by which a large amount of the instantaneous heat generated in a semiconductor package when a substantially instantaneous driving power is applied may be sufficiently dissipated without excessively increasing an IC chip temperature or causing an automatic power shut-off.

SUMMARY

Embodiments of the present inventive concept provide a semiconductor package having a thermal capacitor for storing heat together with a thermal dissipation system.

Another embodiment of the present inventive concept provides a method of manufacturing the above semiconductor package.

According to some embodiments in accordance with the inventive concepts, there is provided a semiconductor package including a circuit board, a semiconductor chip mounted on the circuit board, an encapsulant positioned on the circuit board and encapsulating the semiconductor chip to the circuit board, and a thermal dissipating member positioned on the encapsulant and having a heat spreader for dissipating a driving heat from the semiconductor chip and also having a heat capacitor for absorbing excess heat which may be a portion of the driving heat that exceeds the heat transfer capability of the heat spreader.

In an embodiment in accordance with the inventive concepts, the heat spreader may include a porous bulk metal having thermal conductivity and a plurality of pores. The heat capacitor may include a phase-variable material in the pores of the heat spreader, wherein the phases of the phase-variable material switch as a result of absorbing or discharging the excess heat as a latent heat thereof.

In an embodiment in accordance with the inventive concepts, the bulk metal may include a material selected from the group consisting of copper (Cu), gold (Ag), aluminum (Al) and combinations thereof.

In an embodiment in accordance with the inventive concepts, the phase-variable material may include a material selected from the group consisting of paraffin ($C_{20}$ to about $C_{45}$), mineral salt, organic acid, salt hydrate, sugar alcohol and combinations thereof.

In an embodiment in accordance with the inventive concepts, the phase-variable material may include gallium (Ga).

In an embodiment in accordance with the inventive concepts, the semiconductor package may further include a cover covering the pores of the heat spreader.

In an embodiment in accordance with the inventive concepts, a surface of the semiconductor chip may be exposed through the encapsulant, such that the heat spreader makes direct contact with the semiconductor chip.

In an embodiment in accordance with the inventive concepts, the pores may be arranged at an upper portion of the heat spreader.

In an embodiment in accordance with the inventive concepts, the semiconductor package may further include a thermally conductive adhesive interposed between the thermal dissipating member and the encapsulant such that the thermal dissipating member may be adhered to the encapsulant. The driving heat may be transferred to the thermal dissipating member from the semiconductor chip through the thermally conductive adhesive.

According to other embodiments in accordance with the inventive concepts, there is provided a method of manufacturing the semiconductor package. A preliminary semiconductor package may be formed in such a configuration that a semiconductor chip may be mounted on a circuit board, and the semiconductor chip may be encapsulated by an encapsulant on the circuit board. Then, a thermal dissipating member may be secured onto the preliminary semiconductor package. The thermal dissipating member may include a heat spreader that dissipates a driving heat from the semiconductor chip along with a heat capacitor that absorbs excess heat that represents at least a portion of the driving heat that exceeds the heat transfer capability of the heat spreader.

In an embodiment in accordance with the inventive concepts, the thermal dissipating member may be secured onto the preliminary semiconductor package as follows: The heat spreader may be formed by processing a thermally conductive bulk metal to have a plurality of pores. The heat capacitor comprising phase-variable materials may be formed in the pores of the heat spreader, thereby providing the thermal dissipating member in which the heat spreader and the heat capacitor may be combined together with each other. The thermal dissipating member may be adhered onto the preliminary semiconductor package.

In an embodiment in accordance with the inventive concepts, the thermally conductive bulk metal may be processed by an electrochemical etching process.

In an embodiment in accordance with the inventive concepts, the heat capacitor may be formed as follows: The porous bulk metal may be loaded into a process chamber, and a solid bulk of the phase-variable material may be arranged on the porous bulk metal. The solid bulk of the phase-variable material may be heated under a vacuum state, thereby liquefying the phase-variable material such that the liquefied phase-variable material flows into the pores.

In an embodiment in accordance with the inventive concepts, the heat capacitor may be formed through by dipping the porous heat spreader into a liquid of the phase-variable material, thereby filling up the pores of the heat spreader with the phase-variable material.

In an embodiment in accordance with the inventive concepts, the thermal dissipating member may be secured onto the preliminary semiconductor package as follows: The heat spreader may be formed by processing a thermally conductive bulk metal to have a plurality of pores, and the porous heat spreader may be adhered onto the preliminary semiconductor package. The heat capacitor comprising phase-variable material may be formed in the pores of the heat spreader that may be adhered to the preliminary semiconductor package, thereby providing the thermal dissipating member in which the heat spreader and the heat capacitor are combined together with each other.

According to embodiments of the present inventive concept, when a high power is substantially instantaneously applied to the semiconductor chip resulting in generating a large quantity of driving heat that exceeds the heat transfer capability of the heat spreader, the excess heat exceeding the heat transfer capability of the heat spreader may be absorbed into the heat capacitor as the latent heat of the phase-variable material. Accordingly, the excess heat may be removed from the semiconductor chip as the latent heat of the heat capacitor, thereby preventing an excessive temperature increase of the semiconductor chip notwithstanding the large quantity of the instantaneous driving heat.

BRIEF DESCRIPTION OF THE DRAWINGS

Embodiments in accordance with the inventive concepts will be more clearly understood from the following detailed description taken in conjunction with the accompanying drawings.

DETAILED DESCRIPTION OF THE EMBODIMENTS

Figure 1:
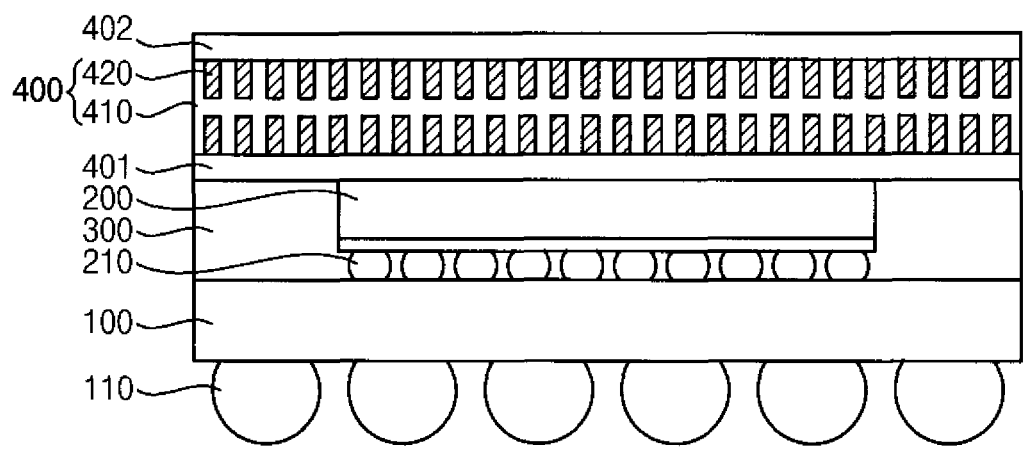
FIG. 1 is a schematic cross-sectional view illustrating a semiconductor package in accordance with an embodiment of the present inventive concept.

Various embodiments in accordance with the inventive concepts, will be described more fully hereinafter with reference to the accompanying drawings, in which some embodiments are shown. The present inventive concepts may, however, be embodied in many different forms and should not be construed as limited to the embodiments set forth herein. Rather, these embodiments are provided so that this disclosure will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include variations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Semiconductor Package

FIG. 1 is a schematic cross-sectional view illustrating a semiconductor package in accordance with an embodiment of the present inventive concept.

Referring to FIG. 1, the semiconductor package 500 in accordance with an embodiment of the present inventive concept may include: a circuit board 100; a semiconductor chip 200 mounted on the circuit board 100; an encapsulant 300 on the circuit board so as to cover the semiconductor chip 200; and, a thermal dissipating member 400 having a heat spreader 410 for dissipating a driving heat from the semiconductor chip 200 and also having a heat capacitor 420 for absorbing an excess heat that may not be sufficiently rapidly dissipated through the heat spreader 410 due to a limited heat transfer rate capability of the heat spreader 410, whereby the excess heat is stored as a latent heat in the heat capacitor 420.

In an embodiment, the circuit board 100 may include a body portion shaped into a plate with a sufficient rigidity and comprising insulating and heat-resistive materials. An inner circuit pattern (not shown) may be arranged in the body portion of the device. The inner circuit pattern may include a plurality of conductive lines and may be connected to a plurality of contact pads (not shown) arranged on front and rear surfaces of the body portion. A contact terminal 110 may be arranged on the contact pad at a rear surface of the body portion, and the external contact element (not shown) may make contact with the contact terminal. The semiconductor chip 200 may make contact with the contact pads on the front surface of the body portion, and thus the semiconductor chip 200 and the external contact element may be electrically connected to each other through the circuit pattern and the contact pads. For example, the contact terminal 110 may include a solder ball.

The body portion may include a thermosetting plastic plate such as an epoxy resin plate and a polyimide plate. Otherwise, the body portion may include a plate on which a heat-resistive organic film, such as a liquid crystal polyester film and a polyamide film, may be coated. The inner circuit pattern may include a plurality of conductive lines or wirings that may be electrically connected with the semiconductor chip 200 and the external contact element. The circuit pattern may include a power line for applying an electric power, a plurality of signal lines for communicating data signals with the semiconductor chip 200 through the circuit pattern, and a ground line for electrically grounding the signal lines and the power line. The conductive lines or the wirings may be electrically insulated from one another by a plurality of insulation interlayers (not shown) that may be arranged on the front and rear surfaces of the body portion. In the embodiment of FIG. 1, for example, the circuit board 100 may include a printed circuit board (PCB) in which the inter circuit pattern may be formed by a printing process.

The semiconductor chip 200 may include an active device, such as an integrated circuit device, mounted on the circuit board 100. Thus, when a driving power is applied to the semiconductor chip, an electrical operation, such as an electrical amplification and an electrical oscillation, may be conducted; and, as a result, a driving heat may be generated from the semiconductor chip 200.

For example, the semiconductor chip 200 may include a plurality of conductive structures (not illustrated) stacked on a semiconductor substrate, such as a silicon wafer using a plurality of insulation interlayers, and a plurality of wiring structures (not illustrated) separated from the conductive structures by the insulation interlayers and transferring signals to the conductive structures. The conductive structures and the wiring structures may be protected from surroundings by a passivation layer.

The conductive structure may include a unit structure of a dynamic random access memory (DRAM) device having a pair comprising a transistor and a capacitor. Otherwise, the conductive structure may include a unit block of a flash memory device having string transistors, selection transistors and ground transistors.

The wiring structure may include a metal plug penetrating through the insulation interlayer and making contact with the conductive structure, and a metal wiring extending on the insulation interlayer and connected to the metal plug. The metal wiring may include a signal line for transferring input/output signals to the conductive structure, a power line for applying an electric power to the conductive structure, and a ground line for electrically grounding the conductive structure.

The semiconductor chip 200 may include a flip chip structure in which an active face of the semiconductor chip 200 may face down toward an upper surface of the circuit board 100; and, thus, interconnectors 210 (such as solder bumps) may be interposed between electrode pads (not shown) of the semiconductor chip 200 and the contact pads of the circuit board 100. Thus, the semiconductor chip 200 may be electrically connected to the circuit board 100 via the interconnectors 210. The interconnector 210 may be bonded to the circuit board 100 by a heat treatment, such as a reflow process; and, the gap space between the semiconductor chip 200 and the upper surface of the circuit board 100 may be filled up with an under-filling layer (not shown). Thus, the semiconductor chip 200 may be electrically and mechanically bonded to the circuit board 100 with high reliability due to the interconnector 210 and the under-filling layer. The semiconductor chip 200 may also be mounted on the circuit board 100 in such a configuration that the active face may face upward; and, thus, the semiconductor chip 200 may be bonded to the circuit board by a bonding wire.

The semiconductor chip may include a single chip structure and a multichip structure, such as a chip stack package in which a plurality of the chips may be stacked. Particularly, the chips of the multichip structure may be electrically connected with each other by various connecting members such as a penetration electrode.

The single chip structure may include a memory device, e.g., a dynamic random access memory (DRAM) device or a flash memory device, and a logic device for driving the memory device. The single chip structure may include a chip scaled package (CSP) having a single semiconductor chip, such as a wafer level chip scaled package (WLCSP), in which a plurality of semiconductor chips and solder bumps may be bonded on a single wafer; and, the assembly of the chips and the solder bumps may be separated into pieces by a unit of the chip. The flip chip structure of the semiconductor chip 200 may be introduced as the single chip structure in the present embodiment.

The multichip structure may include a single semiconductor package structure in which a plurality of memory chips, or at least one memory chip and at least one logic chip, may be stacked on a single circuit board. For example, the logic chip may include a wafer-level chip; and, the memory chip may include a sawed chip; and, thus, a plurality of the sawed chips may be stacked on the wafer-level logic chip, to thereby be manufactured into the multichip structure.

The encapsulant 300 may be arranged on the circuit board 100 to sufficiently cover the semiconductor chip 200; and, thus, the semiconductor chip 200 may be sufficiently encapsulated from external surroundings and may be stably fixed to the circuit board 100. For example, the encapsulant 300 may include an insulating resin having a sufficient rigidity, such as an epoxy resin, a thermosetting resin and a mixture thereof, together with silicate, catalyst, and various pigments. In the present embodiment, the encapsulant 300 may include an epoxy molding compound (EMC) that may cover the front surface of the body of the circuit board 100.

A surface of the semiconductor chip 200 may be coplanar with an upper surface of the encapsulant 300 in such a way that the encapsulant 300 may be planarized until a surface the semiconductor chip 200 may be exposed. Alternatively, in embodiment where the surface of the semiconductor chip 200 is not coplanar with the upper surface of the encapsulant 300, a stepped portion may be provided between the semiconductor chip 200 and the encapsulant 300. In embodiment where the semiconductor chip 200 may include a chip stack package that may be connected to the circuit board 100 by bonding wires, the encapsulant 300 may be provided on the circuit board 100 to a sufficient thickness to cover the chip stack package, thereby improving mechanical reliability of the semiconductor chip 200 on the circuit board 100. In embodiments where the semiconductor chip 200 may include a flip chip structure in such a way that the active face may face downwards to the circuit board 100, an upper portion of the encapsulant 300 may be planarized until a rear surface of the semiconductor chip 200 may be exposed. In the present embodiment, the upper surface of the encapsulant 300 and the rear surface of the semiconductor chip 200 may be coplanar with each other, and thus the semiconductor chip 200 may be exposed through the encapsulant 300.

The heat dissipating member 400 may be arranged on the semiconductor chip 200 and the encapsulant 300, and thus the driving heat generated from the semiconductor chip 200 may be dissipated through the heat dissipating member 400. The heat dissipation member 400 may include a heat spreader 410 for dissipating the driving heat from the semiconductor chip 200 together with a heat capacitor 420 for absorbing the excess heat that may not be sufficiently rapidly dissipated through the heat spreader 410 due to a limited heat transfer rate capability, whereby the excess heat is stored as a latent heat in the heat capacitor 420.

Figure 2A:
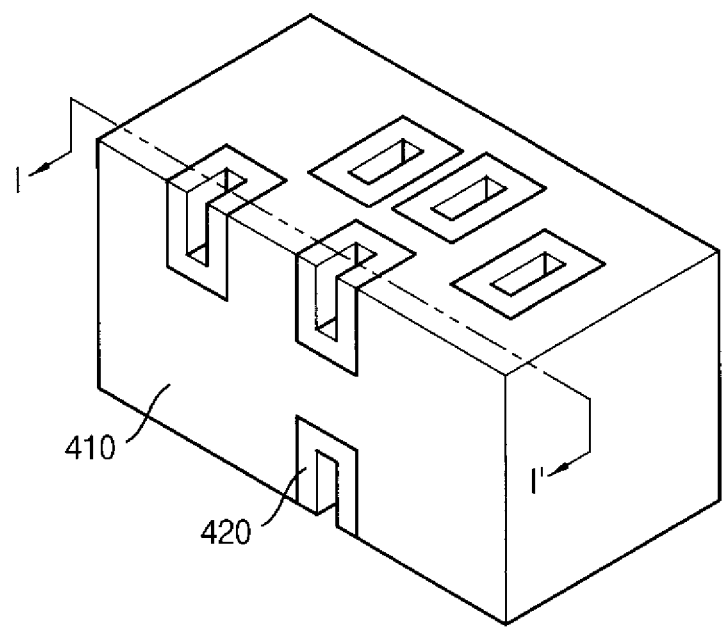
FIG. 2A is a schematic perspective view illustrating the heat dissipating member of the semiconductor package shown in FIG. 1.
Figure 2B:
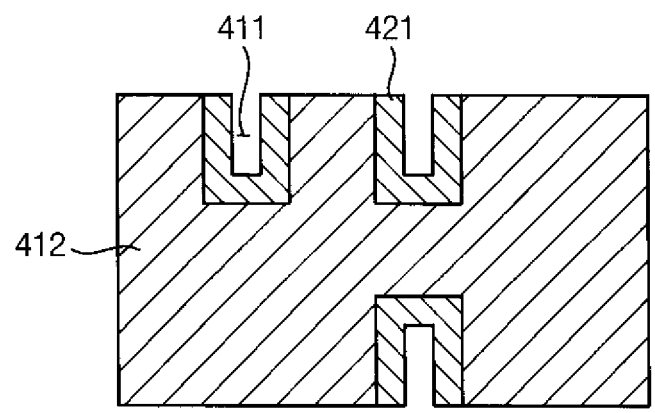
FIG. 2B is a schematic cross-sectional view illustrating the heat capacitor in the heat dissipating member shown in FIG. 2A.

FIG. 2A is a schematic perspective view better illustrating the heat dissipating member 400 of the semiconductor package shown in FIG. 1; and, FIG. 2B is a schematic cross-sectional view better illustrating the heat capacitor in the heat dissipating member shown in FIG. 2A.

The heat spreader 410 may include a porous bulk metal 412 (FIG. 2B) having high thermal conductivity and a plurality of pores 411 therein. The heat capacitor 420 may include a phase-variable layer 421 coated on an inner surface of the pores 411. The phase-variable material used for phase-variable layer 421 may be selected such that a phase of the phase-variable layer 421 may vary between a solid state and a liquid state at a desired phase transition temperature due to the latent heat thereof. Alternatively, the phase-variable layer 421 may be filled into the pores 411 instead of being coated on the inner surface of the pores 411.

Particularly, the bulk metal 412 of the heat spreader 410 may be shaped into a hexahedron shape having a sufficient size to cover the encapsulant 300; and, a plurality of the pores 411 may be prepared in the bulk metal 412.

The bulk metal 412 may have high thermal conductivity but low etch resistance to assist in etching the bulk metal 412 for forming the pores 411. Examples of the bulk metal 412 may include aluminum (Al), gold (Au), silver (Ag), copper (Cu) and combinations thereof. The shape of the bulk metal 412 may be optimized for dissipating the driving heat based on considerations of the size and configurations of the semiconductor package 500 (FIG. 1), the shape of the encapsulant 300, and the usage requirements of the semiconductor package 500. For example, the bulk metal 412 may be arranged on a whole surface of the semiconductor chip 200 and the encapsulant 300, or may be arranged only on the surface of the semiconductor chip 200.

In the present embodiment, the bulk metal 412 may comprise aluminum (Al) and may be shaped into a parallelepiped. However, the heat spreader 410 may comprise any other bulk materials as long as the pores may be easily formed in the bulk material and the bulk material may have a sufficient thermal conductivity.

The pores 411 may be formed in the bulk metal 412 in such a way that the bulk metal 412 may have a sufficient surface for dissipating the driving heat in view of a heat transfer rate of the bulk metal 412 and an allowable maximal value of the driving heat generated during use of the semiconductor device. Because the heat capacitor 420 may be coated on the inner surface of the pores 411, the shape and number of the pores 411 may be determined in view of the configuration of the heat capacitor 420. The pores 411 may be uniformly arranged in the bulk metal 412 or may be intensively positioned around the semiconductor chip 200 from which the driving heat may be generated.

For example, a mask pattern (not shown) may be formed on the bulk metal 412, and the bulk metal 412 may be etched off by an etching process using the mask pattern as an etching mask. Thus, a plurality of the pores 411 may be formed in a controlled process on the bulk metal 412 resulting in recesses having a preset depth and gap distance.

The heat capacitor 420 may comprise a phase-variable material positioned in the pores 411. For example, the heat capacitor 420 may include both the phase-variable layer 421 coated on the inner surface of the pores 411 and also a phase-variable filler filling up in the pores 411.

The phase-variable material may absorb heat corresponding to the latent heat thereof from the semiconductor chip 200 at a phase transition temperature thereof. The phase transition temperature may be an intrinsic physical property of the phase-variable material. For example, when the phase-variable material may be under a solid state, the heat capacitor 420 may absorb the driving heat from the semiconductor chip 200 corresponding to a fusion heat of the phase-variable material by changing the solid phase of the material into the liquid phase at the phase transition temperature.

When a high power is substantially instantaneously applied to the semiconductor chip 200 resulting in generating a large quantity of driving heat that exceeds the heat transfer capability of the heat spreader 410, some of the excess driving heat may be dissipated through the heat spreader 410. The excess heat that exceeds the heat transfer capability of the heat spreader 410 may be absorbed into the heat capacitor 420 as the latent heat of the phase-variable material. Accordingly, the excess heat may be dissipated from the semiconductor chip 200 as the latent heat of the heat capacitor 420, thereby preventing an excessive temperature increase of the semiconductor chip 200 notwithstanding the large quantity of the instantaneous driving heat.

As discussed above, the excess heat that exceeds the heat transfer capability of the heat spreader 410 may be substantially instantaneously generated at particular high operation conditions of the semiconductor package 500. Correspondingly, the amount of driving heat generated may decrease to within the heat transfer capability of the heat spreader 410 when the high operation conditions are varied into normal operation conditions. The driving heat generated under normal operation conditions of the semiconductor package may be sufficiently dissipated through the heat spreader 410 alone, and the temperature of the semiconductor chip 200 may not be increased. However, when a large quantity of driving heat that exceeds the heat transfer capability of the heat spreader 410 is generated substantially instantaneously from the semiconductor chip 200, the semiconductor chip 200 may be sufficiently protected by heat capacitor 420 from an excessive increased temperature, thereby avoiding a forced power shut-off to the semiconductor chip 200. Accordingly, the semiconductor package 500 may be sufficiently operated within full capacitance thereof under a high power, thereby improving a high power performance of the semiconductor package 500 of the present inventive concepts.

In the present embodiment, the heat capacitor 420 may include the phase-variable layer 421 coated on the inner surface of the pores 411, and also a phase-variable filler filling up in the pores 411.

As the phase-variable material may be melted from the solid state into the liquid state, the thermal conductivity of the phase-variable material may be decreased. Thus, most of the excess heat may need to be absorbed by the heat capacitor 420 as the fusion heat of the phase-variable material at the beginning of the phase transition rather than at or near the end of the phase transition so as to increase the heat transfer rate for dissipating the excess heat. For those reasons, the phase-variable layer 421 may be formed in the pores 411 in such a way that the surface area of the phase-variable layer 421 may be as large as possible. Alternatively, when a sufficient number of the pores 411 may be provided with the bulk metal 412, the pores 411 may be filled up with the phase-variable filler.

Examples of the phase-variable material may include paraffin ($C_{20} \sim C_{45}$), mineral salt, organic acid, salt hydrate, sugar alcohol, etc. These may be used alone or in combinations thereof. Particularly, the phase-variable material may be selected from at least one of the following: n-paraffin, pentaerytritol, polyethylene, acetamide, prophylamide, naphthalene, stearic acid, poly glycolic acid, wax, 3-heptadecanone, cyanamide, d-lactic acid, glycerol, acetic acid, ethylene diamine, polyglycolic acid and polyethylene glycol (PEG).

In addition, the phase-variable material may include a salt hydrate selected from at least one of the following: $Na_2SO_4.10H_2O$, $Na_2HPO_4.12H_2O$, $Zn(NO3)2.6H_2O$, $Na_2S_3O_3.5H_2O$, $NaCH_3OCOO.3H_2O$, $MgCl_2.6H_2O$, $Al_2(SO_4)_3.10H_2O$, $NH_4Al(SO_4)_2.12H_2O$, $KAl(SO_4)_2.12H_2O$, $Mg(SO_3)_2.6H_2O$, $SrBr_2.6H_2O$, $Sr(OH)_2.8H_2O$, $Ba(OH)_2.8H_2O$, $Al(NO_3)_2.9H_2O$, $Fe(NO_3)_2.6H_2O$, $NaCH_2S_2O_2.5H_2O$, $Ni(NO3)2.6H_2O$, $Na_2S_2O_2.5H_2O$, $ZnSO_4.7H_2O$ and $CaBr_2.6H_2O$. These may be used alone or in combinations thereof.

Further, the phase-variable material may include a di-n-alkyl ammonium salt having alkyl groups different from each other and mixtures thereof. Particularly, the phase-variable material may be selected from at least one of the following: dihexylammonium bromide, diocthlyammonium bromide, diocthlyammonium chloride, diocthlyammonium acetate, diocthlyammonium nitrate, diocthlyammonium formate, didecylammonium chloride, didecylammonium chlorate, didodecylammonium chlorate, didecylammonium acetate, didodecylammonium formate, didodecylammonium bromide, didodecylammonium nitrate, didodecylammonium acetate, didodecylammonium sulfate, didodecylammonium chloride, didodecylammonium 2-nitrobenzonate and didodecylammonium propionate. These may be used alone or in combinations thereof.

Additionally, the phase-variable material may include a metal having a melting point that is similar to an average operation temperature of the semiconductor chip 200. Thus, the driving heat may be absorbed into the phase-variable metal material as the fusion heat of the metal when the semiconductor chip 200 is operated at a temperature over the average operation temperature. For example, the metal for the phase-variable material of the heat capacitor 420 may include gallium (Ga), with a melting point of about 20° C., and gallium alloys.

A thermally conductive adhesive 401 (FIG. 1) may be further interposed between the heat dissipating member 400 and the encapsulant 300 and/or the semiconductor chip 200. Thus, the thermal dissipating member 400 may be adhered to the encapsulant 300 and/or the semiconductor chip 200. The thermally conductive adhesive 401 may include insulating materials such as epoxy resin, polyimide and permanent photoresist. Furthermore, a supplemental heat-dissipating agent (not shown) may be included in the thermally conductive adhesive 401. Thus, minute grooves and holes between the encapsulant 300 and/or the semiconductor chip 200 and the thermally conductive adhesive 401 may be filled up with the supplemental heat-dissipating agents. The supplemental heat-dissipating agents may comprise thermally conductive materials, so that the heat dissipation from the semiconductor chip 200 to the then dissipating member 400 may be accelerated by the inclusion of such supplemental heat-dissipating agents in adhesive 401.

For example, the supplemental heat-dissipating agent may include a thermal interface material (TIM) layer, a metal paste and nano-sized particles. Particularly, when electrically conductive materials may be included in the thermally conductive adhesive 401, and the thermally conductive adhesive 401 may be connected to an external grounding circuit, the noise characteristics and electromagnetic interference characteristics of the semiconductor package 500 may be improved by the presence of the electrically conductive materials.

When the surface of the semiconductor chip 200 may be coplanar with the upper surface of the encapsulant 300, the semiconductor chip 200 may make direct contact with the thermally conductive adhesive 401. Thus, the driving heat of the semiconductor chip 200 may be directly transferred to the thermal dissipating member 400 through the thermally conductive adhesive 401.

A cover 402 (FIG. 1) may be further provided on the thermal dissipating member 400, and thus the pores 411 may be covered with the cover 402. The cover 402 may have a thermal conductivity higher than that of the heat spreader 410 and the heat capacitor 420, thereby preventing a possible decrease in heat-dissipating performance due to the cover 402. Although the phase-variable material of the heat capacitor 420 may be changed into a liquid state, the liquefied material comprising heat capacitor 420 may be prevented from leaking from the pores 411 because of the surface tension between the phase-variable material and the inner surface of the pores 411. However, when the cover 402 is provided on the thermal dissipating member 400, the leakage of liquefied phase-variable material from the pores 411 may be prevented with greater reliability. The cover 402 may include a conductive adhesive tape and a metal layer.

Figure 3A:
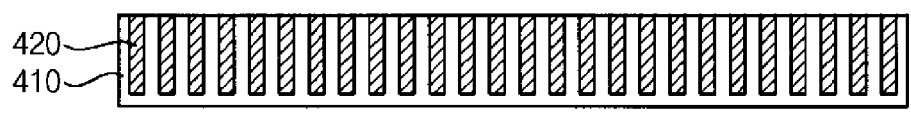
FIGS. 3A to 3C are views schematically illustrating modifications of the thermal dissipating member of the semiconductor package shown in FIG. 1.
Figure 3B:
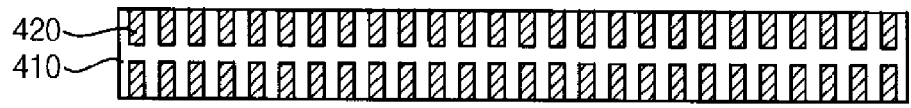
Figure 3C:
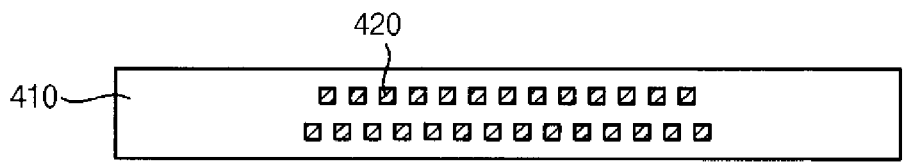

FIGS. 3A to 3C are views schematically illustrating modifications of the thermal dissipating member 400 of the semiconductor package shown in FIG. 1.

As shown in FIGS. 3A and 3B, a plurality of the pores 411 (as seen and labeled in FIG. 2B) may be uniformly arranged on an upper portion and/or a lower portion of the bulk metal 412 of the heat spreader 410 at a constant interval. The uniformly arranged pores 411 may be filled up with the phase-variable materials, thereby providing the heat capacitor 420. Particularly, after the pores 411 are provided at the lower portion of the bulk metal 412 and filled up with the phase-variable materials, the cover 402 may be further provided on the lower portion of the bulk metal 412.

Referring to FIG. 3C, the pores 411 (as seen and labeled in FIG. 2B) may alternatively be arbitrarily or randomly arranged on the bulk metal 412. Thus, the heat capacitor 420 may be arbitrarily or randomly provided on or in the metal bulk 412 of the heat spreader 410. When a portion of the semiconductor chip 200 may be exposed through the encapsulant 300, the heat capacitor 420 may be selectively arranged only on the semiconductor chip 200. As a result, the excess heat that exceeds the heat transfer capability of the heat spreader 410 may be efficiently absorbed into the heat capacitor 420 directly from the heat source, namely from semiconductor chip 200.

While the present embodiment discloses that the semiconductor chip 200 may include a single chip structure and/or a multichip structure, such as a chip stack package, the foregoing single chip structure and the multichip structure are only exemplary embodiments of the inventive concept and should not be construed as limiting thereof. For example, the thermal dissipating member 400 may also be applied to a package on package (POP) structure in which a plurality of the semiconductor packages 500 may be stacked, and to also to a system in package (SIP) structure in which both of active devices and passive devices may be mounted on a single circuit board.

According to the above embodiments of the semiconductor package, when a high power is substantially instantaneously applied to the semiconductor chip 200 and a large quantity of driving heat exceeding the heat transfer capability of the heat spreader 410 may be substantially instantaneously generated from the semiconductor chip 200, the excess heat that exceeds the heat transfer capability of the heat spreader 410 may be absorbed into the heat capacitor 420 as the latent heat of the phase-variable material. Accordingly, the excess heat may be dissipated from the semiconductor chip 200 as the latent heat of the heat capacitor 420, thereby preventing an excessive temperature increase of the semiconductor chip 200 notwithstanding the large, substantially instantaneous quantity of driving heat that may be generated.

Method of Manufacturing the Semiconductor Package

Figure 4:
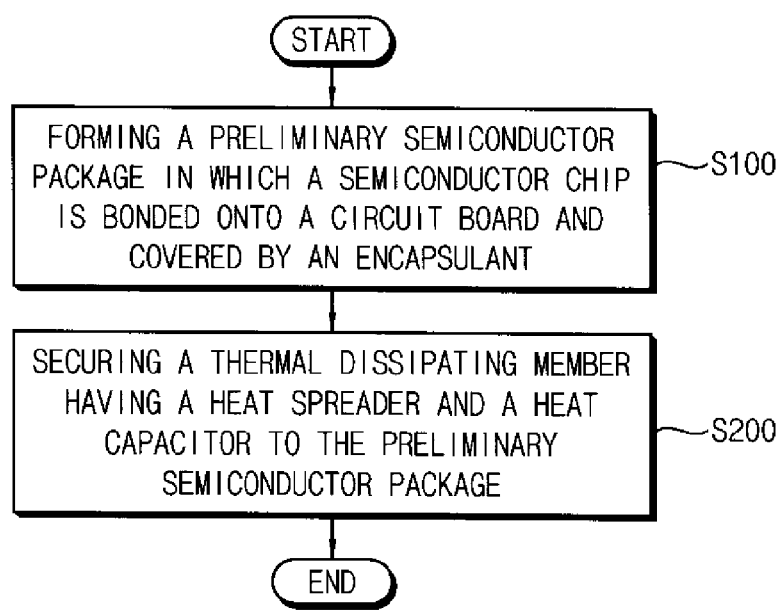
FIG. 4 is a flow chart showing a method of manufacturing the semiconductor package shown in FIG. 1.

FIG. 4 is a flow chart showing a method of manufacturing the semiconductor package shown in FIG. 1.

Referring to FIGS. 1 and 4, the semiconductor chip 200 may be mounted on the circuit board 100 and the encapsulant 300 may be formed on the circuit board 100 to a sufficient thickness to cover the semiconductor chip 200, thereby forming a preliminary semiconductor package (step S100). The preliminary semiconductor package may be formed through various packaging processes according to the shape and structure of the circuit board 100 and the semiconductor chip 200.

In addition, an upper portion of the encapsulant 300 may be selectively planarized until the surface of the semiconductor chip 200 may be exposed, and thus the semiconductor chip 200 may be coplanar with the encapsulant 300.

Then, the thermal dissipating member 400 may be formed on the preliminary semiconductor package (step S200), thereby manufacturing the semiconductor package 500 shown in FIG. 1. The heat capacitor 420 for absorbing the excess heat may be added to the heat spreader 410; and, the thermal dissipating member, including the heat capacitor 420 and the heat spreader 410. may be adhered to the preliminary semiconductor package.

The thermal dissipating member 400 may be secured to the preliminary semiconductor package in various manners. For example, the thermal dissipating member 400 may be adhered to the preliminary semiconductor package by an adhesive member such as the thermally conductive adhesive 401. Alternatively, the thermal dissipating member 400 may be detachably connected to the preliminary semiconductor package by a suitable coupler.

The cover 402 may be further formed on the top and/or bottom surfaces of the thermal dissipating member 400, thereby preventing leakage of the phase-variable materials from the pores 411. For example, the cover 402 may also be secured to the heat spreader 410 by an adhesive.

Figure 5:
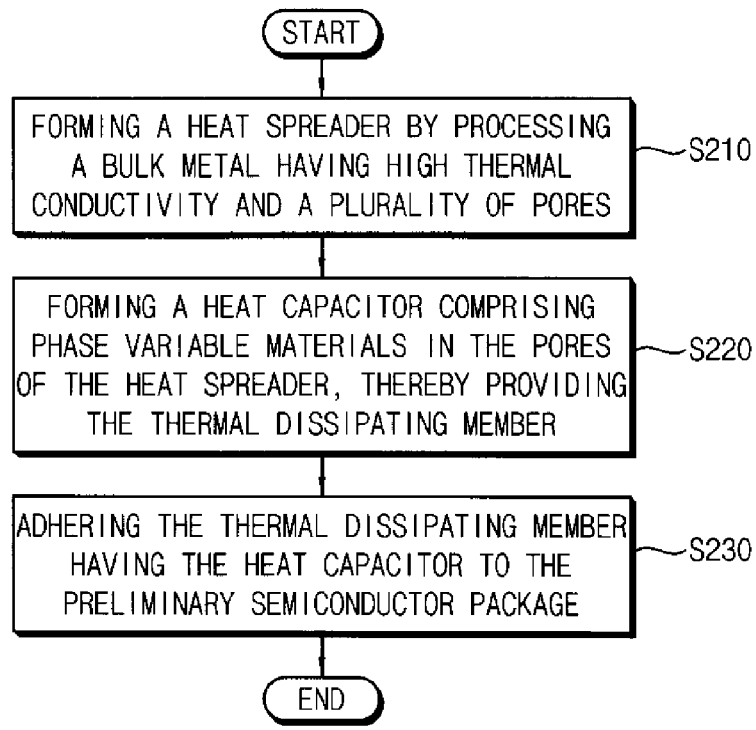
FIG. 5 is a flow chart showing the processing steps for a method of securing the thermal dissipating member to the preliminary semiconductor package shown in FIG. 4 in accordance with an embodiment of the present inventive concept.

FIG. 5 is a flow chart showing the processing steps for a method of securing the thermal dissipating member to the preliminary semiconductor package prepared according to the process of FIG. 4 in accordance with an embodiment of the present inventive concept.

Referring to FIG. 5, the heat spreader 410 may be formed by processing a bulk metal having high thermal conductivity and a plurality of pores (Step S210). A plurality of the pores 411 may be formed on the bulk metal, and thus the porous bulk metal 412 may be prepared for the heat spreader 410.

For example, a mask pattern may be formed on the bulk metal having high thermal conductivity, and thus the bulk metal may be partially exposed through the mask pattern. Then, the bulk metal may be partially etched off by an etching process using the mask pattern as an etching mask, thereby forming the pores 411 on the bulk metal. The bulk metal may have a sufficient size to cover the preliminary semiconductor package; and, the process conditions of the etching process may be varied according to the bulk metal.

For example, the etching process may include a dry etching process, such as a plasma etching process, and a wet etching process using an etchant having etching selectivity with respect to the bulk metal. In the present embodiment, the bulk metal may comprise aluminum (Al), and the pores 411 may be formed by an electrochemical etching process. In such a case, the size, depth and number of the pores 411 may be varied by varying the compositions of an etchant, varying an etching temperature, and/or varying a current intensity of the electrochemical etching process.

Then, the heat capacitor 420 comprising phase-variable materials may be formed in the pores 411 (step S220), thereby forming the thermal dissipating member 400.

Figure 6:
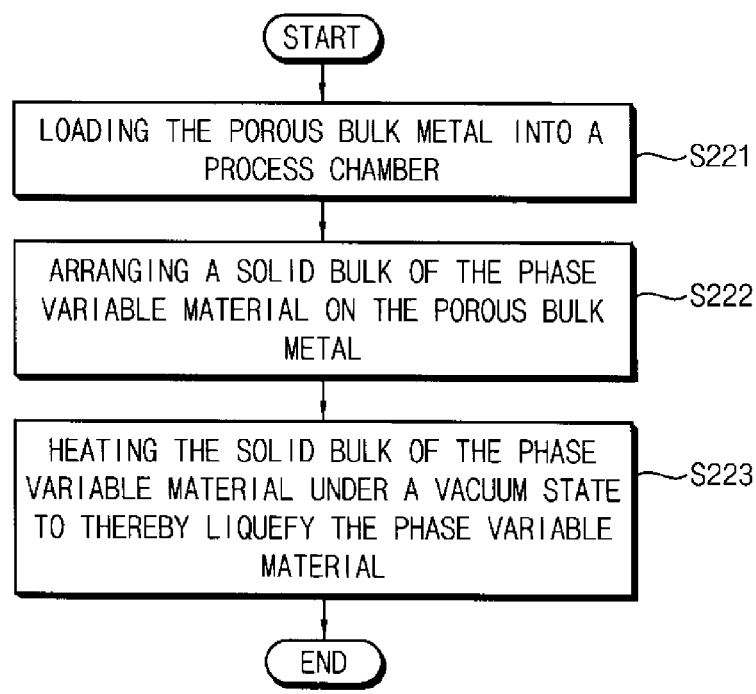
FIG. 6 is a flow chart showing process steps for a method of forming the heat capacitor shown in FIG. 5.

FIG. 6 is a flow chart showing process steps for a method of forming the heat capacitor prepared according to the process of FIG. 5.

Referring to FIG. 6, the porous bulk metal 412 may be loaded into a process chamber to which a vacuum pressure may be applied (step S221), and a solid bulk of the phase-variable material may be arranged on the porous bulk metal 412 in the process chamber (step S222). Then, the solid bulk of the phase-variable material may be heated to a high temperature under a vacuum state in the process chamber, and thus the solid bulk of the phase-variable material may be liquefied (step S223). At this point, the liquefied phase-variable material may flow into the pores 411 of the bulk metal 412.

The liquefied phase-variable material may be coated on the inner surface of the pores 411 or may fill up the pores 411 according to the liquefied quantity and viscosity of the phase-variable material. That is, the phase-variable layer 421 or the phase-variable filler may be formed in the pores according to the liquefied quantity and viscosity of the phase-variable material. Particularly, the phase-variable layer 421 may be more efficient for absorbing the excess heat than the phase-variable filler due to a larger surface area for the phase-variable layer.

Alternatively, the heat capacitor 420 may be formed by using a liquid state phase-variable material. For example, the porous bulk metal 412 may be dipped into a solution having the phase-variable material or into a liquid of the phase-variable material. In another example, the liquid of the phase-variable material may be supplied into the pores 411 of the bulk metal 412. Then, the liquid phase-variable material may be consolidated into the solid state of the phase-variable material in the pores 411, thereby forming the heat capacitor 420.

Accordingly, the thermal dissipating member 400 may be formed in such a way that the heat spreader 410 and the heat capacitor 420 in the pores 411 may be combined into one body.

Then, the thermal dissipating member 400 may be adhered to the preliminary semiconductor package (step S230) (FIG. 5), to thereby manufacture the semiconductor package 500. For example, the adhesive 401 including thermal interface materials (TIM) may be coated on the preliminary semiconductor package, and the thermal dissipating member 400 may then be positioned on the adhesive 401. Preferably, the cover 402 may be formed on the lower surface of the preliminary semiconductor package, thereby preventing leakage of the phase-variable material from the pores 411 prior to the step of adhering the thermal dissipating member 400 to the preliminary semiconductor package.

Figure 7:
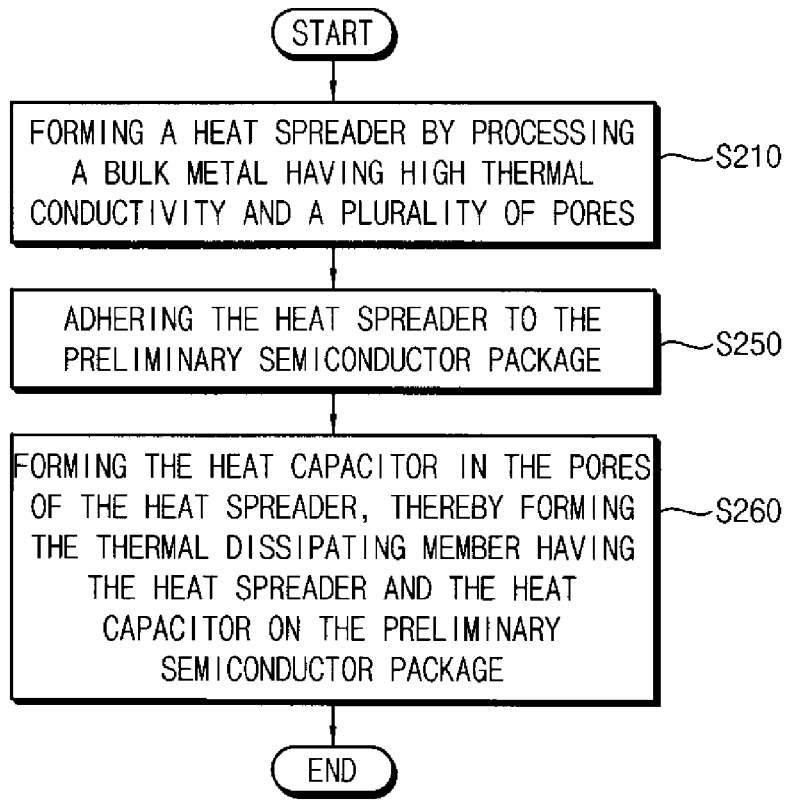
FIG. 7 is a flow chart showing the processing steps for a method of securing the thermal dissipating member to the preliminary semiconductor package shown in FIG. 4 in accordance with another embodiment of the present inventive concept.

FIG. 7 is a flow chart showing the processing steps for a method of securing the thermal dissipating member to the preliminary semiconductor package prepared according the process of FIG. 4 in accordance with another embodiment of the present inventive concept.

Referring to FIG. 7, the heat spreader 410 may be formed as the porous bulk metal 411 by the same processing step as the step S210. Then, the porous bulk metal 411 of the heat spreader 410 may be adhered to the preliminary semiconductor package (step S250). The heat spreader 410 may be firmly adhered to the preliminary semiconductor package by an adhesive or may be detachably secured to the preliminary semiconductor package by a coupler such as a clip.

Thereafter, the phase-variable material may be coated on the inner surface of the pores of the heat spreader 410 or may be filled into the pores of the heat spreader 410, thereby forming the heat capacitor 420 in the pores 411 of the heat spreader 410, and also thereby forming the completed thermal dissipating member 400, including both the heat spreader 410 and the heat capacitor 420, on the preliminary semiconductor package (step S260). For example, a powder including the phase-variable materials may be injected into the pores 411 of the heat spreader 410.

Thereafter, the cover 402 may be further formed on the thermal dissipating member 400, thereby preventing leakage of the phase-variable materials from the pores 411 of the heat spreader 410. The cover 402 may include an electrically conductive adhesive or a metal thin layer.

Experiments on the Dissipating Effect of the Semiconductor Package

Dissipating Effect when a High Power is Substantially Instantaneously Applied

An experimental semiconductor package (fabricated according to the present inventive concept, hereinafter the "experimental package") having the heat spreader and the heat capacitor according to the present inventive concepts, and a comparative semiconductor package (fabricated in accordance with conventional heat dissipation techniques, hereinafter the "comparative package") just having the heat spreader but without the heat capacitor according to the present inventive concepts, were prepared in rectangular shapes in a size of 10 mm×10 mm. Then, a normal driving power of about 1 W and a high driving power of about 5 W were alternately and repeatedly applied to each of the experimental package and the comparative package for a time period of about 0.5 second under standard still air convection conditions of JEDEC (Joint Electron Device Engineering Council). The power was applied to a power area of about 3 mm×3 mm at each of the experimental package and the comparative package.

Then, the temperature was repeatedly measured on surfaces of the experimental semiconductor package (having the heat capacitor in accordance with the present inventive concepts) and the comparative semiconductor package (without the heat capacitor), respectively.

Figure 8A:
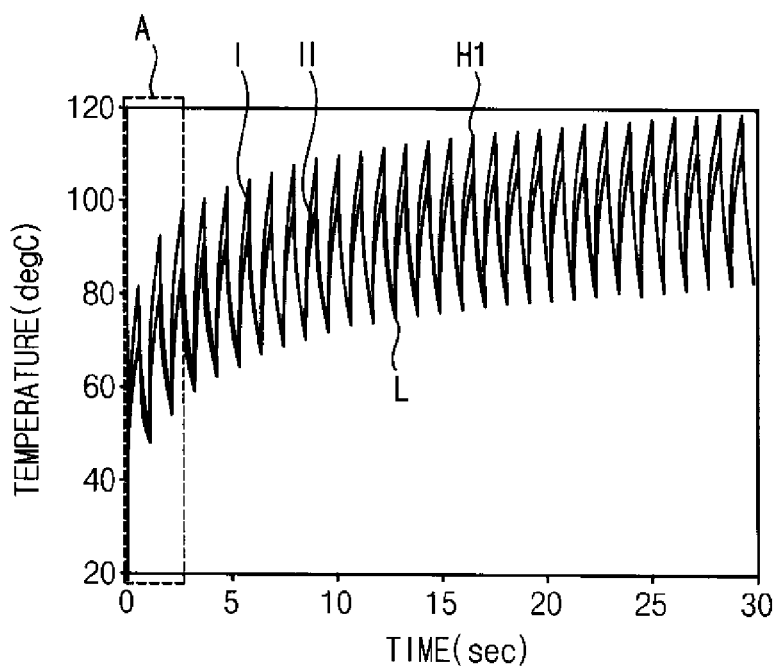
FIG. 8A is a graph showing the surface temperature of two differently fabricated semiconductor packages according to alternation between normal power and high power.
Figure 8B:
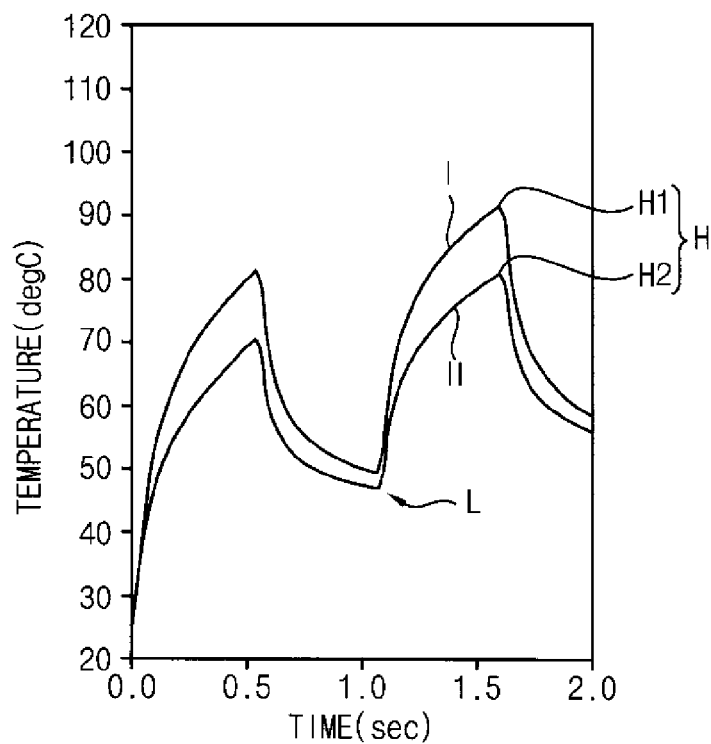
FIG. 8B is an enlarged graph of a portion A shown in FIG. 8A.

FIG. 8A is a graph showing the surface temperatures of the two semiconductor packages during the alternations between normal power and high power. FIG. 8B is an enlarged graph of a portion A of the graph of FIG. 8A to more clearly illustrate the surface temperature variations. In FIGS. 8A and 8B, Graph I denotes the surface temperatures of the comparative package, and Graph II denotes the surface temperatures of the experimental package. In FIG. 8A, the curve of the portion A indicates the transient temperature characteristics of the two semiconductor packages at the very moment when the power is applied to the packages; and, the curve of the residual portion of this graph (excepting the portion A) indicates the steady temperate characteristics of the two packages when the power is applied to the packages for a sufficient time and the packages are under a steady state. In addition, the capital letter 'L' denotes a minimal (lowest) surface temperature of the packages when normal power is applied; and, the capital letter 'H' denotes a maximal (highest) surface temperature of the packages when high power is applied.

Referring to FIG. 8A, the surface temperature of the experimental package (II) was found to be lower than that of the comparative package (I) irrespective of the transient state and the steady state when normal power and high power were alternately applied. These experimental results show that the excess heat, which was the driving heat exceeding the heat transfer capability of the heat spreader by itself, was sufficiently absorbed into the heat capacitor of the experimental package irrespective of the transient state and the steady state such that the surface temperature of the experimental package remained relatively low. By comparison, the excess heat generated in the comparative package was not sufficiently dissipated and thus led to a relatively large increase in the surface temperature of the comparative package because no heat capacitor was provided in the comparative package. Therefore, the heat capacitor resulted in reduced surface temperatures for the experimental semiconductor package under operating conditions.

The temperature reduction for the experimental package was much more noticeable at the maximal temperature H than at the minimal temperature L. When normal power was applied to the experimental package and the comparative package, the driving heat generated from the semiconductor chips were lower and generally within the heat transfer capability or the dissipation capacity of the heat spreader alone. Thus, under such normal power conditions, the heat absorbed into the heat capacitor of the experimental package was relatively insignificant, and the minimal temperatures L of the experimental package and the comparative package were close to each other. That is, the temperature reduction was very small around the minimal temperature L in comparing the performance of the experimental package and the comparative package. However, when high power was applied to the experimental package and the comparative package, the driving heat generated from the semiconductor chip exceeded the heat transfer capability or the dissipation capacity of the heat spreader alone; and thus the heat spreader alone was not sufficient to dissipate the generated heat. Thus, as better seen in FIG. 8B, a significant amount of the excess heat was absorbed into the heat capacitor of the experimental package, resulting in maximal temperatures H2 of the experimental package that were markedly lower than the maximal temperature H1 of the comparative package. That is, the temperature reduction resulting from practice of the present inventive concept was very large around the maximal temperature H in comparing the performance of the experimental package and the comparative package.

As shown in FIG. 8B, the maximal temperature H2 of the experimental package was about 70° C. while the maximal temperature H1 of the comparative package was about 80° C. That is, the heat capacitor of the experimental semiconductor package reduced the surface temperature of the experimental package by as much as about 10° C., and the heat-dissipation capacity of the experimental package was increased as much as about 12.5% by incorporating a heat capacitor in accordance with the present inventive concepts.

Performance Duration Time when a High Power is Applied

A high power of about 15 W was applied to the experimental package (fabricated according to the present inventive concept) and to the comparative package (fabricated in accordance with conventional heat-dissipation techniques) for a preset period of time. Then, a performance duration time and a critical time were measured for the experimental package and the comparative package, respectively. An allowable maximal temperature of a semiconductor package is referred to as the critical temperature of the package, and the critical time denotes an elapsed time from an initial point (when the power is first applied) to a critical point (when the surface temperature of the package reaches the critical temperature).

Figure 9A:
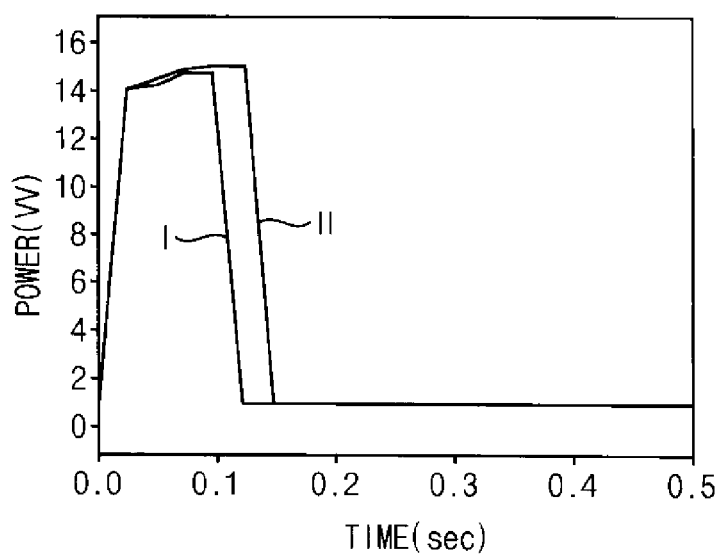
FIG. 9A is graph showing power variation of an experimental semiconductor package (fabricated in accordance with the present inventive concept) and a comparative semiconductor package (fabricated in accordance with conventional heat dissipation techniques) over a period of time.
Figure 9B:
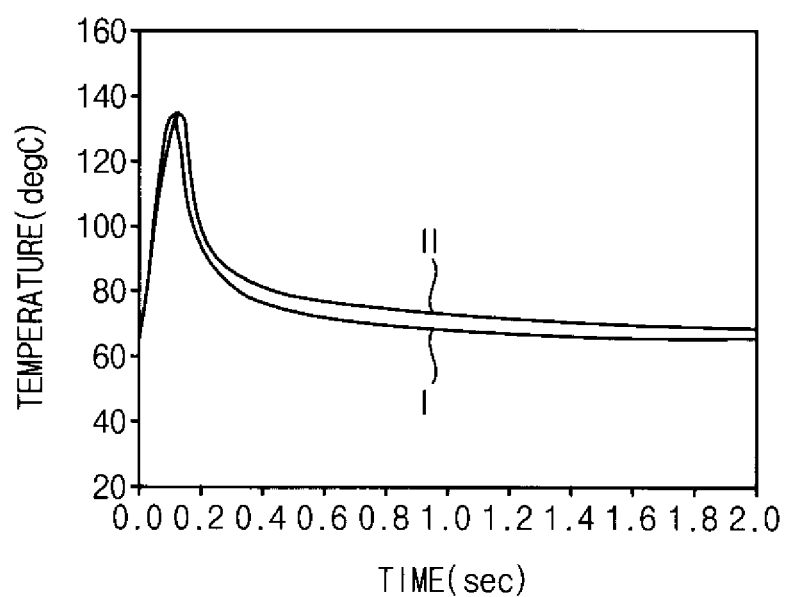
FIG. 9B is a graph showing surface temperatures of the experimental semiconductor package and the comparative semiconductor package of FIG. 9A over a period of time.

FIG. 9A is graph showing power variation for the experimental package (II) and the comparative package (I) with respect to time. FIG. 9B is a graph showing surface temperatures of the experimental package (II) and the comparative package (I) with respect to time. The critical temperature of the experimental package and the comparative package was set to be identical; and, the same temperature controller was installed to control both the experimental package and the comparative package. When the temperature controller detected the temperature of the semiconductor chip to reach the critical temperature in either of the packages, the power was obliged to be turned off by the temperature controller, thereby controlling the driving heat.

Referring to FIG. 9A, when the high power of about 15 W was applied to the comparative package, the comparative package operated under that high power between the times of about 0.05 second to about 0.11 second. At about a time of 0.11 second, however, the high power was forced to be shut off by the temperature controller, and instead a normal power of about 1 W was applied to the comparative package. Therefore, the comparative package was only able to operate under maximal performance for about 0.06 second. Thus, the performance duration time for the comparative package was measured to be about 0.06 second when applying the high power of about 15 W.

In contrast, when the high power of about 15 W was applied to the experimental package, the experimental package operated under that high power between the times of about 0.05 second to about 0.15 second. At about a time of 0.15 second, however, the high power was forced to be shut off by the temperature controller, and instead a normal power of about 1 W was applied to the experimental package. Therefore, the experimental package was able to operate under maximal performance for about 0.10 second. Thus, the performance duration time for the experimental package was measured to be about 0.10 second when applying the high power of about 15 W. Accordingly, the performance duration time of the experimental package was improved by about 0.04 second compared with the performance duration time of the comparative package, which indicates the performance duration time increased by about 66% as compared with the comparative package.

Referring to FIG. 9B, the critical time of the comparative package was only about 0.05 second while that of the experimental package was about 0.10 second. Thus, the absorption of the excess heat by the heat capacitor increased the critical time of the experimental package by about 100% as compared with the comparative package.

When the normal power was applied to the packages by the temperature controller, the driving heat was decreased and the surface temperatures of the two packages were also reduced. However, in the case of the experimental package, when normal power conditions were applied the excess heat previously absorbed into the phase-variable material of the heat capacitor was again discharged through the phase change and was dissipated outwards through the heat spreader. Thus, the surface temperature of the experimental package was measured to be higher than that of the comparative package for a time period following the application of normal power to the respective packages. For those reasons, Graph II is shown above Graph I (i.e., indicating a higher surface temperature) in FIG. 9B.

According to the embodiments of the semiconductor package and the method of manufacturing the same in accordance with the inventive concepts, the heat capacitor for temporarily storing heat by using a phase-variable material may be provided in the heat spreader having a porous bulk metal. Thus, when a high power may be substantially instantaneously applied to the semiconductor chip such that a large quantity of the driving heat exceeding the heat transfer capability of the heat spreader may be generated from the semiconductor chip, the excess heat exceeding the heat transfer capability of the heat spreader may be absorbed into the heat capacitor as the latent heat of the phase-variable material. The excess heat may thus be removed from the semiconductor chip as the latent heat of the heat capacitor, thereby preventing an excessive temperature increase of the semiconductor chip notwithstanding the large quantity of the driving heat. Accordingly, the semiconductor package according to the inventive concepts may be operated under the maximal performance for a longer time.

The present embodiments of the memory device may be applied to various electronic systems including semiconductor devices and IC chips such as telecommunication systems and storage systems. Particularly, the recent mobile application processor (AP) requires stable operation under much higher performance for a much longer time than ever before due to the very high level of mobile data traffic. In such conventional APs, the performance duration time of the AP may be increased without any other modification of form factors and product spaces just by replacing the conventional heat sink with the porous heat spreader according to the inventive concepts and by forming the phase-variable material in the pores of that heat spreader.

The foregoing is illustrative of exemplary embodiments and is not to be construed as limiting thereof. Although a few embodiments have been described, those skilled in the art will readily appreciate that many modifications are possible in the embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various inventive embodiments and is not to be construed as limited to the specific embodiments disclosed, and that modifications to the disclosed embodiments, as well as other embodiments, are intended to be included within the scope of the appended claims.

What is claimed is:

1. A semiconductor package comprising:
a circuit board;
a semiconductor chip mounted on the circuit board;
an encapsulant positioned on the circuit board and encapsulating the semiconductor chip to the circuit board; and
a thermal dissipating member positioned on the encapsulant, the thermal dissipating member comprising a heat spreader portion with pores therein for dissipating the driving heat from the semiconductor chip together with a heat capacitor portion located in the pores of the heat spreader portion for absorbing excess driving heat that may not be sufficiently rapidly dissipated through the heat spreader portion due to a limited heat transfer capability of the heat spreader portion, and wherein the heat capacitor portion includes a phase-variable material in the pores that may vary between a solid state and a liquid state at a desired phase transition temperature experienced during operation conditions of the semiconductor chip.

2. The semiconductor package of claim 1, wherein the heat spreader portion includes a porous bulk metal having thermal conductivity and a plurality of pores therein.

3. The semiconductor package of claim 2, wherein the bulk metal includes a material selected from the group consisting of copper (Cu), gold (Ag), aluminum (Al) and combinations thereof.

4. The semiconductor package of claim 3, wherein the phase-variable material includes a material selected from the group consisting of paraffin ($C_{20}$ to about $C_{45}$), mineral salt, organic acid, salt hydrate, sugar alcohol and combinations thereof.

5. A semiconductor package comprising:
a circuit board;
a semiconductor chip mounted on the circuit board;
an encapsulant positioned on the circuit board and encapsulating the semiconductor chip to the circuit board; and a thermal dissipating member positioned on the encapsulant, the thermal dissipating member comprising a heat spreader portion with pores therein for dissipating the driving heat from the semiconductor chip together with a heat capacitor portion located in the pores of the heat spreader portion for absorbing excess driving heat that may not be sufficiently rapidly dissipated through the heat spreader portion due to a limited heat transfer capability of the heat spreader portion, and wherein the heat capacitor portion includes a phase-variable material in the pores that may vary between a solid state and a liquid state at a desired phase transition temperature experienced during operation conditions of the semiconductor chip;

wherein the heat spreader portion includes a porous bulk metal having thermal conductivity and a plurality of pores therein;

also wherein the bulk metal includes a material selected from the group consisting of copper (Cu), gold (Ag), aluminum (Al) and combinations thereof;

also wherein the phase-variable material includes a material selected from the group consisting of paraffin ($C_{20}$ to about $C_{45}$), mineral salt, organic acid, salt hydrate, sugar alcohol and combinations thereof; or wherein the phase-variable material includes gallium (Ga).

6. The semiconductor package of claim 2, further comprising a cover covering the pores of the heat spreader portion of the thermal dissipating member having the phase-variable material therein.

7. The semiconductor package of claim 2, wherein a surface of the semiconductor chip is exposed through the encapsulant and the heat spreader portion of the thermal dissipating member makes direct contact with the semiconductor chip.

8. The semiconductor package of claim 1, further comprising a thermally conductive adhesive interposed between the thermal dissipating member and the encapsulant such that the thermal dissipating member is adhered to the encapsulant, the driving heat being transferred to the thermal dissipating member from the semiconductor chip through the thermally conductive adhesive.

9. A semiconductor package comprising: a circuit board; a semiconductor chip mounted on the circuit board; an encapsulant positioned on the circuit board and encapsulating the semiconductor chip to the circuit board; and a thermal dissipating member positioned on the encapsulant comprising a heat spreader portion that dissipates a driving heat from the semiconductor chip;

the improvement comprising a heat capacitor portion located in pores of the heat spreader portion, said heat capacitor portion comprising a phase-variable material that changes phases from a solid phase at normal operation conditions to a liquid phase at a higher temperature that is below the maximum acceptable operating temperature of the semiconductor package.

10. The improvement of claim 9, wherein the heat spreader portion comprises a porous bulk metal having thermal conductivity selected from the group consisting of copper (Cu), gold (Ag), aluminum (Al) and combinations thereof, with a plurality of pores therein, and the heat capacitor portion comprises the phase-variable material in the pores of the heat spreader portion.

11. The improvement of claim 9, wherein the phase-variable material includes a material selected from the group consisting of paraffin ($C_{20}$ to about $C_{45}$), mineral salt, organic acid, salt hydrate, sugar alcohol and combinations thereof.

12. The improvement of claim 9, wherein the phase-variable material changes phases from a solid phase to a liquid phase at a temperature of about 10° C. below the critical temperature of the semiconductor package.

13. The improvement of claim 9, wherein the phase-variable material changes phases from a solid phase to a liquid phase at a temperature of about 70° C.

14. The semiconductor package of claim 5, further comprising a cover covering the pores of the heat spreader portion of the thermal dissipating member having the phase-variable material therein.

15. The semiconductor package of claim 5, wherein a surface of the semiconductor chip is exposed through the encapsulant and the heat spreader portion of the thermal dissipating member makes direct contact with the semiconductor chip.

16. The semiconductor package of claim 5, further comprising a thermally conductive adhesive interposed between the thermal dissipating member and the encapsulant such that the thermal dissipating member is adhered to the encapsulant, the driving heat being transferred to the thermal dissipating member from the semiconductor chip through the thermally conductive adhesive.

17. The improvement of claim 9, wherein the phase-variable material includes gallium (Ga).

18. The improvement of claim 9, further comprising a cover covering the pores of the heat spreader portion of the thermal dissipating member having the phase-variable material therein.

19. The improvement of claim 9, wherein a surface of the semiconductor chip is exposed through the encapsulant and the heat spreader portion of the thermal dissipating member makes direct contact with the semiconductor chip.

20. The improvement of claim 9, further comprising a thermally conductive adhesive interposed between the thermal dissipating member and the encapsulant such that the thermal dissipating member is adhered to the encapsulant, the driving heat being transferred to the thermal dissipating member from the semiconductor chip through the thermally conductive adhesive.

* * * * *